(12) United States Patent
Kim et al.

(10) Patent No.: US 11,174,549 B2
(45) Date of Patent: Nov. 16, 2021

(54) SUBSTRATE PROCESSING METHODS

(71) Applicant: SAMSUNG ELECTRONICS CO., LTD., Suwon-si (KR)

(72) Inventors: Sun-Cheul Kim, Hwaseong-si (KR); Kap-Soo Lee, Suwon-si (KR); Keun-Young Lee, Suwon-si (KR); Hong-Taek Lim, Seoul (KR); Jeong-Woo Hyun, Seoul (KR); Dong-Hoon Han, Seoul (KR)

(73) Assignee: Samsung Electronics Co., Ltd.

( * ) Notice: Subject to any disclaimer, the term of this patent is extended or adjusted under 35 U.S.C. 154(b) by 194 days.

(21) Appl. No.: 16/420,725

(22) Filed: May 23, 2019

(65) Prior Publication Data
US 2020/0141000 A1 May 7, 2020

(30) Foreign Application Priority Data
Nov. 2, 2018 (KR) .................. 10-2018-0133556

(51) Int. Cl.
*C23C 16/02* (2006.01)
*C23C 16/44* (2006.01)
(Continued)

(52) U.S. Cl.
CPC ...... *C23C 16/4405* (2013.01); *C23C 16/0272* (2013.01); *C23C 16/06* (2013.01); *C23C 16/34* (2013.01); *C23C 16/50* (2013.01); *H01J 37/32467* (2013.01); *H01J 37/32862* (2013.01); *H01L 21/28556* (2013.01); *H01J 2237/3321* (2013.01); *H01L 27/11556* (2013.01); *H01L 27/11582* (2013.01)

(58) Field of Classification Search
CPC ............ C23C 16/0272; C23C 16/0227; C23C 16/0236
See application file for complete search history.

(56) References Cited

U.S. PATENT DOCUMENTS 3,898,351 A * 8/1975 Kennison .................. B08B 3/08
427/560
5,294,572 A * 3/1994 Granneman ...... H01L 21/67167
438/694
(Continued)

FOREIGN PATENT DOCUMENTS

CN 1418736 A * 5/2003 ............... B05B 7/04
CN 101315874 B * 1/2012 ............. H01L 21/00
(Continued)

OTHER PUBLICATIONS

Vossen, J.L., "The preparation of substrates for film deposition using glow discharge techniques". J. Phys. E: Sci. Instrum., vol. 12, 1979, pp. 159-167.*
(Continued)

*Primary Examiner* — Bret P Chen
(74) *Attorney, Agent, or Firm* — Myers Bigel, P.A.

(57) ABSTRACT

In a substrate processing method, a cleaning process is performed at a first temperature to remove a portion of a cumulative layer that is deposited within a chamber by deposition processes (step 1). The deposition processes are performed at the first temperature on a plurality of substrates within the chamber respectively (step 2). The step 1 and the step 2 are performed alternately and repeatedly.

13 Claims, 13 Drawing Sheets

(51) Int. Cl.
    *C23C 16/50*         (2006.01)
    *C23C 16/06*         (2006.01)
    *C23C 16/34*         (2006.01)
    *H01L 21/285*       (2006.01)
    *H01J 37/32*         (2006.01)
    H01L 27/11556     (2017.01)
    H01L 27/11582     (2017.01)

(56) References Cited

U.S. PATENT DOCUMENTS

| | | | | |
|---|---|---|---|---|
| 5,380,370 | A * | 1/1995 | Niino | C23C 16/24 |
| | | | | 134/2 |
| 5,843,239 | A * | 12/1998 | Shrotriya | B08B 7/0035 |
| | | | | 134/1.1 |
| 5,954,887 | A | 9/1999 | Hatano | |
| 6,210,481 | B1 * | 4/2001 | Sakai | B05B 15/555 |
| | | | | 118/697 |
| 6,277,194 | B1 | 8/2001 | Thilderkvist et al. | |
| 7,063,749 | B2 * | 6/2006 | Sugarman | B08B 1/04 |
| | | | | 134/1.3 |
| 7,833,911 | B2 | 11/2010 | Katsumata et al. | |
| 8,691,023 | B2 | 4/2014 | Bao et al. | |
| 8,932,405 | B2 * | 1/2015 | Grabolla | C30B 25/08 |
| | | | | 118/719 |
| 9,187,319 | B2 | 11/2015 | Wei et al. | |
| 9,735,026 | B2 * | 8/2017 | Brown | H01L 21/31138 |
| 2001/0004878 | A1 * | 6/2001 | Sakai | B05B 15/555 |
| | | | | 118/70 |
| 2001/0037761 | A1 * | 11/2001 | Ries | C23C 16/4584 |
| | | | | 117/200 |
| 2002/0185053 | A1 * | 12/2002 | Fei | G01N 21/9501 |
| | | | | 117/2 |
| 2003/0049372 | A1 * | 3/2003 | Cook | H01L 21/67017 |
| | | | | 427/248.1 |
| 2003/0183244 | A1 * | 10/2003 | Rossman | B08B 7/0035 |
| | | | | 134/1.1 |
| 2004/0261815 | A1 * | 12/2004 | Pavone | C23C 16/4405 |
| | | | | 134/1.3 |
| 2005/0026434 | A1 * | 2/2005 | Huy | H01L 21/3185 |
| | | | | 438/689 |
| 2006/0090700 | A1 * | 5/2006 | Satoh | C23F 4/00 |
| | | | | 118/715 |
| 2006/0234503 | A1 * | 10/2006 | Yamada | C23C 18/1628 |
| | | | | 438/667 |
| 2007/0224811 | A1 * | 9/2007 | Wang | H01L 21/67046 |
| | | | | 438/678 |
| 2009/0068849 | A1 * | 3/2009 | Endo | C23C 16/4585 |
| | | | | 438/763 |
| 2009/0095221 | A1 * | 4/2009 | Tam | C23C 16/34 |
| | | | | 118/715 |
| 2009/0098276 | A1 * | 4/2009 | Burrows | C23C 16/45565 |
| | | | | 427/8 |
| 2009/0239078 | A1 * | 9/2009 | Asmussen | C30B 25/08 |
| | | | | 428/408 |
| 2010/0029065 | A1 * | 2/2010 | Nagashima | C23C 16/303 |
| | | | | 438/478 |
| 2011/0086184 | A1 * | 4/2011 | Okabe | C23C 16/50 |
| | | | | 427/576 |
| 2012/0091095 | A1 | 4/2012 | Wang et al. | |
| 2013/0025624 | A1 * | 1/2013 | Kim | C23C 16/4405 |
| | | | | 134/1.2 |
| 2013/0276820 | A1 * | 10/2013 | Cigal | B08B 7/0035 |
| | | | | 134/1.1 |
| 2014/0251375 | A1 * | 9/2014 | Holden | B08B 5/00 |
| | | | | 134/7 |
| 2014/0287588 | A1 * | 9/2014 | Takahashi | C23C 16/0227 |
| | | | | 438/694 |
| 2015/0041802 | A1 * | 2/2015 | Yamazaki | H01L 27/1157 |
| | | | | 257/43 |
| 2015/0348773 | A1 * | 12/2015 | Zhu | H01J 37/3426 |
| | | | | 438/503 |
| 2018/0155829 | A1 | 6/2018 | Tamura et al. | |
| 2018/0277849 | A1 * | 9/2018 | Gayden | H01M 4/626 |
| 2018/0327907 | A1 * | 11/2018 | Vitiello | C23C 14/5846 |

FOREIGN PATENT DOCUMENTS

| | | | | |
|---|---|---|---|---|
| JP | 2001-176843 | A | 6/2001 | |
| JP | 2012-216636 | | * 11/2012 | H01L 21/304 |
| JP | 2016-222488 | A | * 12/2016 | C03C 15/00 |
| KR | 10-0440064 | B1 | 7/2004 | |
| KR | 10-2005-0093187 | A | 9/2005 | |
| KR | 10-0601034 | B1 | 7/2006 | |
| TW | 1293578 | B | * 2/2008 | G03F 7/16 |

OTHER PUBLICATIONS

Timm, Rainer, et al., "Self-cleaning and surface chemical reactions during hafnium dioxide atomic layer deposition on indium arsenide". Nature Communications (2108) 9: 1412, pp. 1-9. DOI: 10.1038/s41467-018-03855-z.*

Brachmann, Erik, et al., "Evaluation of Surface Cleaning Procedures for CTGS Substrates for SAW Technology with XPS". Materials, 2017, 12, 1373, pp. 1-10. doi:10.3390/ma10121373.*

Lisco, F., et al., "Surface Activation of Rigid and Flexible Substrates for Thin Film Photovoltaics using Atmospheric Pressure Plasma". 2016 IEEE 43rd Photovoltaic Specialists Conference (PVSC), Portland, OR, 2016, pp. 2204-2209, doi: 10.1109/PVSC.2016.7750026.*

Chapter 3—Surface Preparation for Film and Coating Deposition Processes, Editor(s): Peter M. Martin, Handbook of Deposition Technologies for Films and Coatings (Third Edition), William Andrew Publishing, 2010, pp. 93-134. https://doi.org/10.1016/B978-0-8155-2031-3.00003-X.*

Pearton, S.J, et al., "A Review of Dry Etching of GaN and Related Materials". MRS Internet J. Nitride Semicond. Res. 5, 11 (2000) pp. 1-38.*

Brachmann, Erik, et al., "Evaluation of Surface Cleaning Procedures for CTGS Substrates for SAW Technology with XPS". Materials, 2017, 12, 1373, pp. 1-10.*

* cited by examiner

SUBSTRATE PROCESSING METHODS

RELATED APPLICATION

This application claims priority under 35 U.S.C. § 119 to Korean Patent Application No. 10-2018-0133556, filed on Nov. 2, 2018 in the Korean Intellectual Property Office (KIPO), the contents of which are herein incorporated by reference in their entirety.

FIELD OF THE INVENTION

Example embodiments relate to a plasma deposition method and a plasma deposition apparatus. More particularly, example embodiments relate to a substrate processing method and a substrate process apparatus for cleaning deposition equipment which is used for manufacture of a semiconductor device.

BACKGROUND

In deposition equipment used for manufacturing a semiconductor device, a layer may be deposited on a substrate such as a wafer, as well as on inner components within a chamber. As the deposition processes are performed repeatedly within the chamber, a thickness of a cumulative layer deposited within the chamber may be increased, and thus, particles may occur. Accordingly, a cleaning process may be required to remove the accumulative layer. However, a conventional cleaning process may cause damage to the inner components within the chamber, and because the conventional cleaning process may be performed at temperatures relatively lower than the temperature in the deposition process, the deposition equipment typically needs to be stopped for the cleaning process, thereby reducing productivity.

SUMMARY

Example embodiments provide a substrate processing method capable of preventing inner components of a chamber from being damaged and improving productivity.

According to example embodiments, in a substrate processing method, a cleaning process is performed at a first temperature to remove a portion of a cumulative layer that is deposited within a chamber by deposition processes (step 1). The deposition processes are performed at the first temperature on a plurality of substrates within the chamber respectively (step 2). The step 1 and the step 2 are performed alternately and repeatedly.

According to example embodiments, in a substrate processing method, deposition processes are performed at a first temperature on a plurality of substrates within a chamber respectively to deposit a cumulative layer having a first thickness within the chamber (step 1). A partial cleaning process is performed on the cumulative layer such that the cumulative layer has a second thickness less than the first thickness (step 2). The deposition processes are performed at the first temperature on a plurality of substrates within the chamber respectively to deposit the cumulative layer having the first thickness within the chamber (step 3). The step 2 and the step 3 are performed alternately and repeatedly.

According to example embodiments, in a substrate processing method, deposition processes are performed on a plurality of substrates within a chamber respectively. A cleaning process is performed to remove a portion of a cumulative layer that is deposited within the chamber by the deposition processes. The deposition processes are performed repeatedly within the chamber.

According to example embodiments, in a substrate process method, a partial cleaning process for removing a portion of a cumulative layer deposited within a chamber by deposition processes may be performed in-site with the deposition processes at the same temperature as in the deposition processes. When the partial cleaning process is performed, a flow direction of a cleaning gas and a distance between a substrate stage and a shower head may be adjusted. After performing the cleaning process, a buffer layer may be formed on the remaining cumulative layer within the chamber.

Accordingly, the partial cleaning process may be performed in-situ with the deposition processes at the same temperature as in the deposition processes, to thereby improve process productivity. Additionally, the flow direction of the cleaning gas supplied into the chamber may be adjusted to provide uniform concentration distribution and the distance between the substrate stage and the shower head may be adjusted to provide uniform temperature distribution within the chamber, such that the cumulative layer remaining within the chamber is maintained to have a uniform thickness. Thus, maintenance time of the deposition equipment may be shortened and thickness distribution between layers deposited on the wafers may be improved and damage to inner components within the chamber by the cleaning process may be prevented.

Further, the buffer layer may alleviate a surface of the cumulative layer partially removed by the partial cleaning process, such that the cumulative layer has uniform emissivity. Accordingly, a deposition process to be performed after the partial cleaning process may have a process condition the same as that of the deposition process prior to the partial cleaning process.

BRIEF DESCRIPTION OF THE DRAWINGS

Example embodiments will be more clearly understood from the following detailed description taken in conjunction with the accompanying drawings. FIGS. 1 to 11 represent non-limiting, example embodiments as described herein.

FIG. 1 is a block diagram illustrating a substrate processing apparatus in accordance with example embodiments.

FIG. 2 is a block diagram illustrating the substrate processing apparatus in FIG. 1, where a substrate stage is lowered.

FIG. 3 is a flow chart illustrating a substrate processing method in accordance with example embodiments.

FIG. 4 is a timing diagram illustrating the substrate processing method in FIG. 3.

FIG. 5 is a timing diagram illustrating a partial cleaning process performed in-situ with a deposition process in the substrate processing method in FIG. 3.

FIGS. 7 to 11 are cross-sectional views illustrating a method of manufacturing a semiconductor device in accordance with example embodiments.

DETAILED DESCRIPTION OF EXAMPLE EMBODIMENTS

Hereinafter, example embodiments will be explained in detail with reference to the accompanying drawings.

Figure 1:
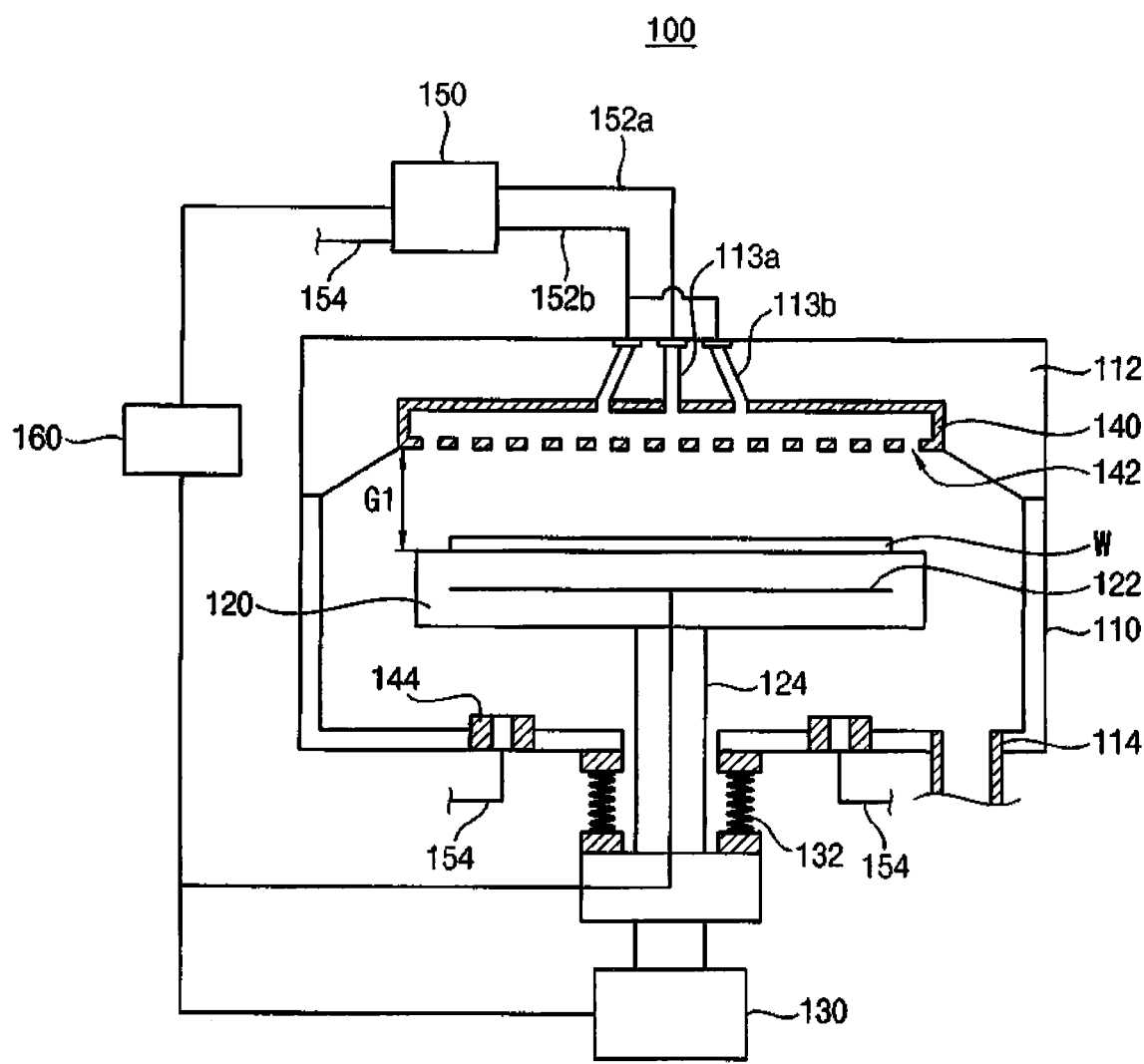
Figure 2:
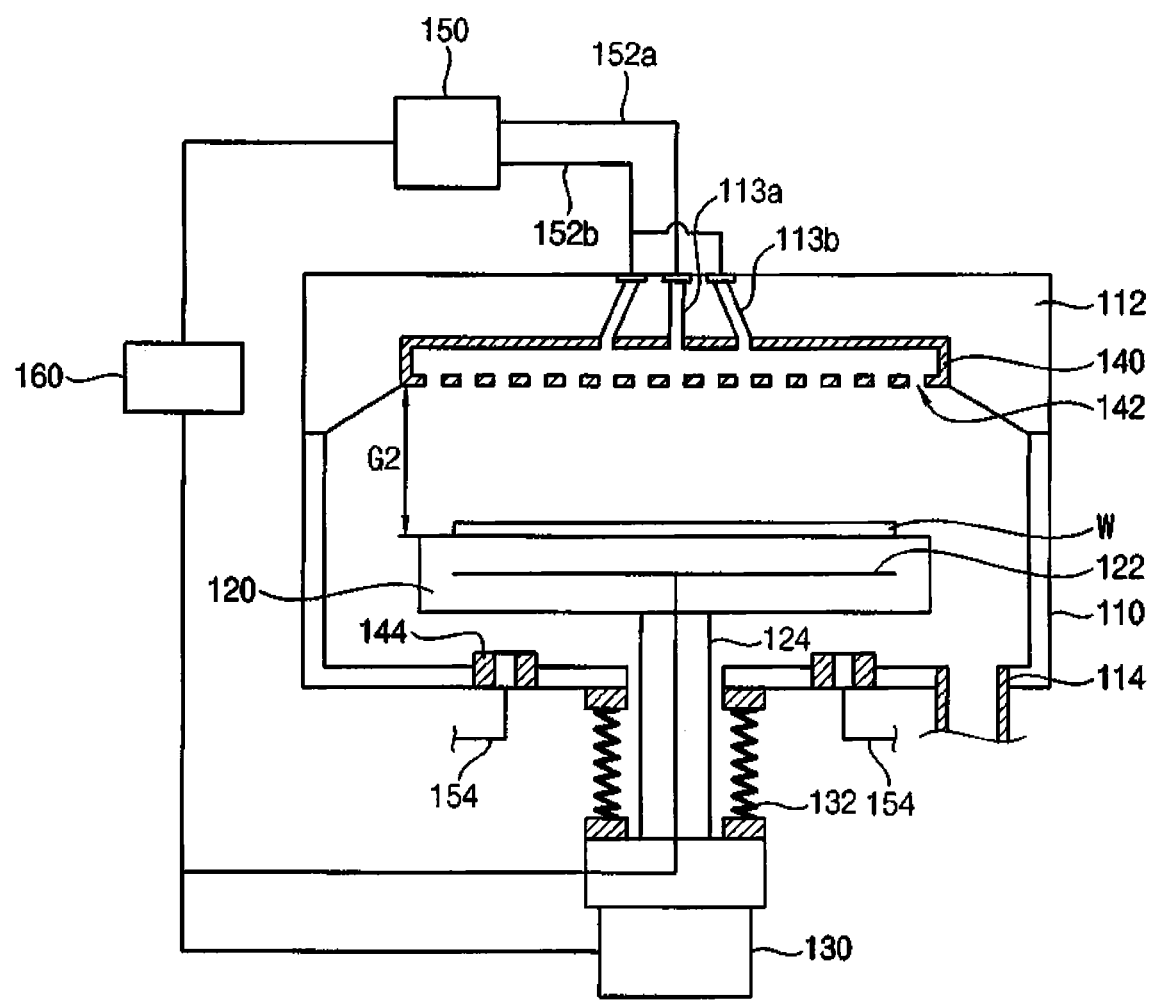

FIG. 1 is a block diagram illustrating a substrate processing apparatus in accordance with example embodiments. FIG. 2 is a block diagram illustrating the substrate processing apparatus in FIG. 1, where a substrate stage is lowered.

Referring to FIGS. 1 and 2, a substrate processing apparatus 100 may include a chamber 110, a substrate heater assembly, a gas distribution assembly, and a gas supply. The substrate processing apparatus 100 may further include an exhaust unit, etc.

In example embodiments, the substrate processing apparatus 100 may be a deposition apparatus configured to form a layer on a substrate such as a semiconductor wafer W. For example, the substrate processing apparatus 100 may be a chemical vapor deposition (CVD) apparatus or an atomic layer deposition (ALD) apparatus configured to form a metal nitride layer such as titanium nitride (TiN) layer on the substrate. However, it may not be limited thereto, and, for example, the substrate processing apparatus 100 may be an etching apparatus. Here, the substrate may include a semiconductor substrate, a glass substrate, etc.

The chamber 110 may include a processing container having a cylindrical shape. The chamber 110 may include aluminum, stainless steel, etc. A gate (not illustrated) for a loading/unloading of the wafer W may be provided in a sidewall of the chamber 110. The wafer W may be loaded/unloaded onto/from a substrate heater of the substrate stage 120 through the gate.

The exhaust unit may be connected to an exhaust port 114 which is installed in a bottom portion of the chamber 110, through an exhaust line. The exhaust unit may include a vacuum pump such as a turbo-molecular pump or the like, to control a pressure of the chamber 110 so that a processing space inside the chamber 110 may be depressurized to a desired vacuum level. Additionally, process by-products and residual process gases may be discharged from the chamber 110 through the exhaust port 114. Alternatively, the exhaust port 114 may be installed in the sidewall of the chamber 110

The substrate heater assembly may include the substrate stage 120 arranged within the chamber 110 to support the substrate. The substrate stage 120 may include a heater 122 configured to heat the substrate to a desired temperature. For example, the heater 122 may include a resistive coil. The substrate stage 120 may include an insulation material such as alumina, aluminum nitride, etc. The heater 122 may be heated to a temperature range of about 400° C. to about 700° C. The coil may be arranged concentrically. Additionally, a heater (not illustrated) may be installed in the sidewall of the chamber 110 to control a temperature of the chamber 110 during a layer deposition process and a cleaning process. For example, the temperature of the chamber 110 may be maintained at about 400° C. to about 600° C.

Additionally, the substrate stage 120 may further include an electrostatic electrode (not illustrated) configured to hold the wafer W thereon using electrostatic force.

In example embodiments, the substrate heater assembly may include a lift mechanism configured to elevate the substrate stage 120. The lift mechanism may include a driving motor 130 to elevate a support shaft 124 connected to the substrate stage 120. The driving motor 130 may elevate the support shaft 124 through a gear drive.

The lift mechanism may include a bellows 132 attached between an end portion of the support shaft 124 and the bottom of the chamber 110. The bellows 132 may allow a free vertical movement of the support shaft 124 and may create an air tight seal between the chamber 110 and the outside.

In example embodiments, the gas distribution assembly may include a gas distribution block 112 installed in an upper portion of the chamber 110 and a shower head 140 as an upper gas injection nozzle installed on a lower surface of the gas distribution block 112. Additionally, the gas distribution assembly may include at least one lower gas injection nozzle 144.

The shower head 140 may be installed over the substrate stage 120 to face the substrate stage 120. The shower head 140 may supply a gas from above the substrate stage 120. The lower gas injection nozzle 144 may be installed below the substrate stage 120. The lower gas injection nozzle 144 may supply a gas from below the substrate stage 120.

The shower head 140 may have a plurality of injection holes 142 which extend to a lower surface of the shower head 140. A first gas passage 113a and a second gas passage 113b may be formed in the gas distribution block 112 to be connected to a distribution space of the shower head 140.

The shower head 140 may supply a source gas and a reaction gas as a thin-film source gas, a first cleaning gas and a carrier gas from above the substrate stage 120 into the chamber 110 through the injection holes 142. The lower gas injection nozzle 144 may supply a second cleaning gas and a carrier gas from below the substrate stage 120 into the chamber 110.

In example embodiments, the gas supply may include a gas supply source 150 and gas supply lines 152a, 152b, 154 connected to the gas supply source to supply the gas from the gas supply source 150 to the chamber 110. The first gas supply line 152a may be connected to the first gas passage 113a, and the second gas supply line 152b may be connected to the second gas passage 113b.

The gas supply source 150 may include a source gas supply source for supplying the source gas, a reaction gas supply source for supplying the reaction gas, a carrier gas supply source for supplying the carrier gas.

For example, the source gas from the source gas supply source 150 may be introduced into the shower head 140 through the first gas supply line 152a. The reaction gas from the reaction gas supply source may be introduced to the shower head 140 through the second gas supply line 152b. The first cleaning gas from the cleaning gas supply source may be introduced to the shower head 140 through the first and second gas supply lines 152a, 152b. The carrier gas from the carrier gas supply source may be introduced to the shower head 140 through the first and second supply lines 152a, 152b. The second cleaning gas from the cleaning gas supply source may be introduced to the lower gas injection nozzle 144 through the third gas supply line 154.

The source gas may include a titanium chloride ($TiCl_4$) gas. The reaction gas may include an ammonia ($NH_3$) gas, a hydrogen ($H_2$) gas, etc. The first and second cleaning gases may include a chlorine fluoride ($ClF_3$) gas. The carrier gas may include a nitrogen ($N_2$) gas, an argon (Ar) gas, etc.

A controller 160 may monitor outputs from the substrate processing apparatus 100 and control operations thereof. The controller may include a microcomputer and various interface circuits. The controller 160 may be connected to the heater 122, the driving motor 130, the exhaust unit, etc., and may communicate information therebetween. Programs stored in the memory may be used to control components of the substrate processing apparatus 100 based on stored recipe information.

In example embodiments, the substrate processing apparatus 100 may perform sequentially deposition processes on a plurality of wafers W on the substrate stage 120 within the chamber 110.

In the deposition process, the chamber 110 may be maintained at a temperature of about 550° C. The source gas from the source gas supply source may be introduced to the shower head 140 through the first gas supply line 152a and the first gas passage 113a, and the shower head 140 may inject the source gas on the wafer W on the substrate stage 120. Then, the reaction gas from the reaction gas supply source may be introduced to the shower head 140 through the second gas supply line 152b and the second gas passage 113b, and the shower head 140 may inject the reaction gas on the wafer W on the substrate stage 120. Thus, a titanium nitride (TiN) layer may be formed on the wafer W. For example, the deposition processes may be performed sequentially on 200 to 2000 wafers W. In here, reaction products such as the titanium nitride (TiN) layer may be deposited on inner components within the chamber 110 such as the chamber sidewall, the substrate stage, the shower head, etc.

In example embodiments, the substrate processing apparatus 100 may perform a cleaning process to remove a cumulative layer deposited within the chamber 110 after performing the deposition processes. The cleaning process may include a partial cleaning process for removing a portion of the cumulative layer and a full cleaning process for removing the whole remaining portion of the cumulative layer.

In the cleaning process, the chamber 110 may be maintained at temperature of about 550° C. In the partial cleaning process, an intensity distribution of the cleaning gas supplied into the chamber 110 may be adjusted such that the remaining portion of the cumulative layer after the partial cleaning process has a uniform thickness.

In particular, the first cleaning gas from the cleaning gas supply source may be introduced to the shower head 140 through the first gas supply line 152a and the first gas passage 113a, and the shower head 140 may inject the first cleaning gas from above the substrate stage 120 into the chamber 110. The first cleaning gas from the cleaning gas supply source may be introduced to the shower head 140 through the second gas supply line 152b and the second gas passage 113b, and the shower head 140 may inject the first cleaning gas from above the substrate stage 120 into the chamber 110.

The first cleaning gas may be introduced to the shower head 140 through a first gas supply path of the first gas supply line 152a and the first gas passage 113a and/or a second gas supply path of the second gas supply line 152b and the second gas passage 113b, and then, injected into the chamber 110. Here, the first cleaning gas may be introduced to the shower head 140 through any one of the first gas supply path and the second gas supply path or may be introduced to the shower head 140 through both of the first gas supply path and the second gas supply path.

The second cleaning gas from the cleaning gas supply source may be introduced to the lower gas injection nozzle 144 through the third gas supply line 154, and the lower gas injection nozzle 144 may inject the second cleaning gas from below the substrate stage 120 into the chamber 110. A flow rate of the first cleaning gas may be the same as or different from a flow rate of the second cleaning gas.

For example, the flow rate of the second cleaning gas may be greater than the flow rate of the first cleaning gas. Thus, at least a portion of the cumulative layer (TiN layer) deposited within the chamber 110 may be removed uniformly.

Additionally, in the partial cleaning process, a distance between the substrate stage and the shower head 140 may be adjusted to provide a uniform temperature distribution within the chamber 110. Thus, the thickness of the remaining portion of the cumulative layer after the partial cleaning process is uniform.

For example, as illustrated in FIG. 1, while a distance between the substrate stage 120 and the shower head 140 is maintained at a first gap G1, the cleaning process may be performed. The lift mechanism may raise the support shaft 124 to maintain the first gap G1 between the substrate stage 120 and the shower head 140.

As illustrated in FIG. 2, while a distance between the substrate stage 120 and the shower head 140 is maintained at a second gap G2 greater than the first gap G1 the cleaning process may be performed. The lift mechanism may lower the support shaft 124 to maintain the second gap G2 between the substrate stage 120 and the shower head 140.

In example embodiments, the substrate processing apparatus 100 may perform a pre-coating process for forming a buffer layer on a surface of the remaining cumulative layer, after performing the partial cleaning process. The pre-coating process may be performed similarly to the deposition process.

In the pre-coating process, the chamber 110 may be maintained at a temperature of about 550° C. The source gas from the source gas supply source may be introduced to the shower head 140 through the first gas supply line 152a and the first gas passage 113a, and the shower head 140 may inject the source gas into the chamber 110. Then, the reaction gas from the reaction gas supply source may be introduced to the shower head 140 through the second gas supply line 152b and the second gas passage 113b, and the shower head 140 may inject the reaction gas on the wafer W on the substrate stage 120. Thus, the buffer layer may be formed on the remaining cumulative layer within the chamber 110. The buffer layer may include a material (that is, titanium nitride (TiN)) the same as the cumulative layer.

The buffer layer may alleviate the surface of the cumulative layer partially removed by the partial cleaning process, such that the cumulative layer has uniform emissivity. Accordingly, a deposition process to be performed after the partial cleaning process may have a process condition the same as that of the deposition process prior to the partial cleaning process.

Hereinafter, a method of processing a substrate using the substrate processing apparatus in FIG. 1 will be explained.

Figure 3:
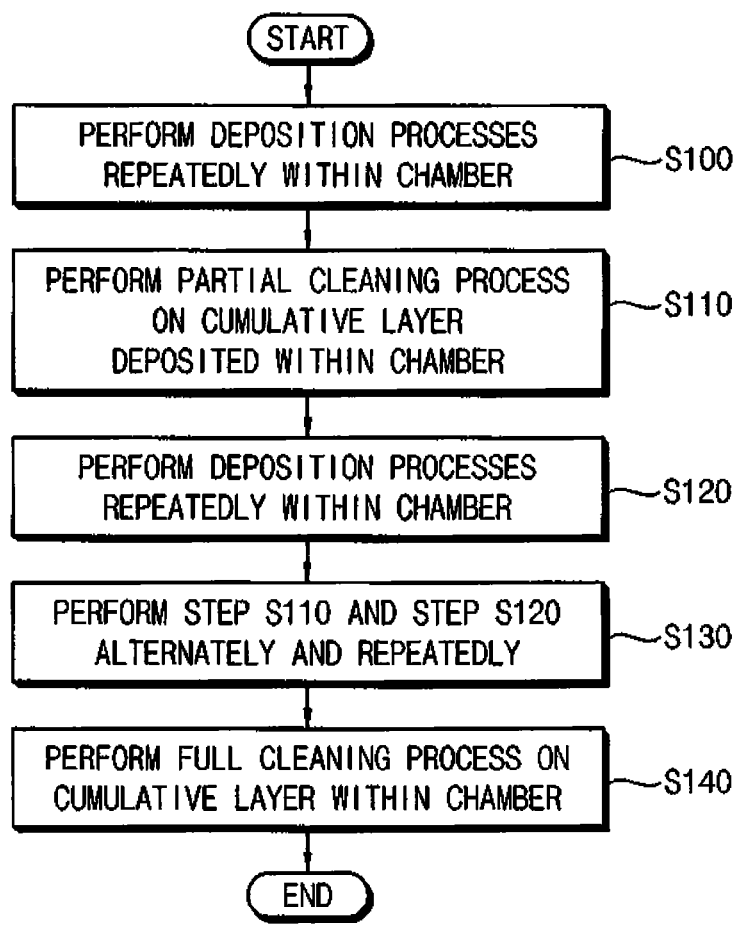
Figure 4:
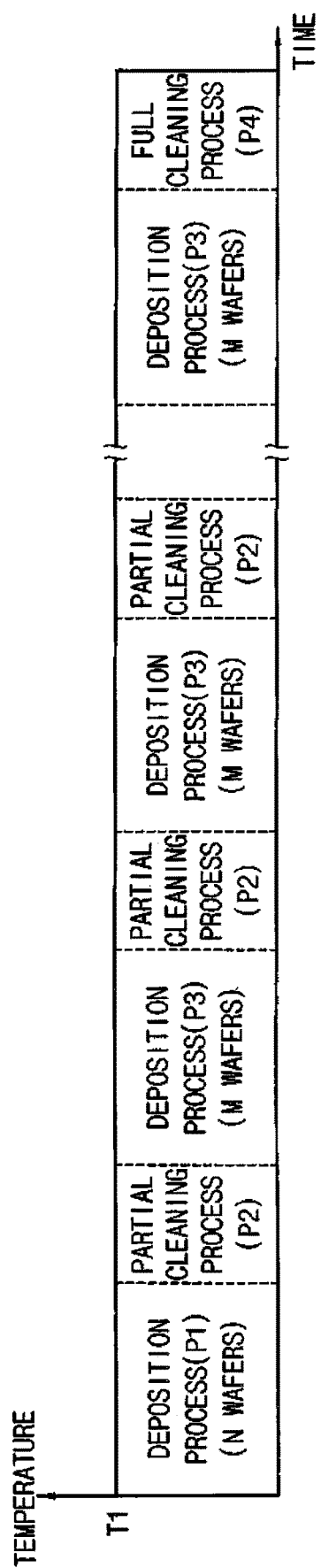
Figure 5:
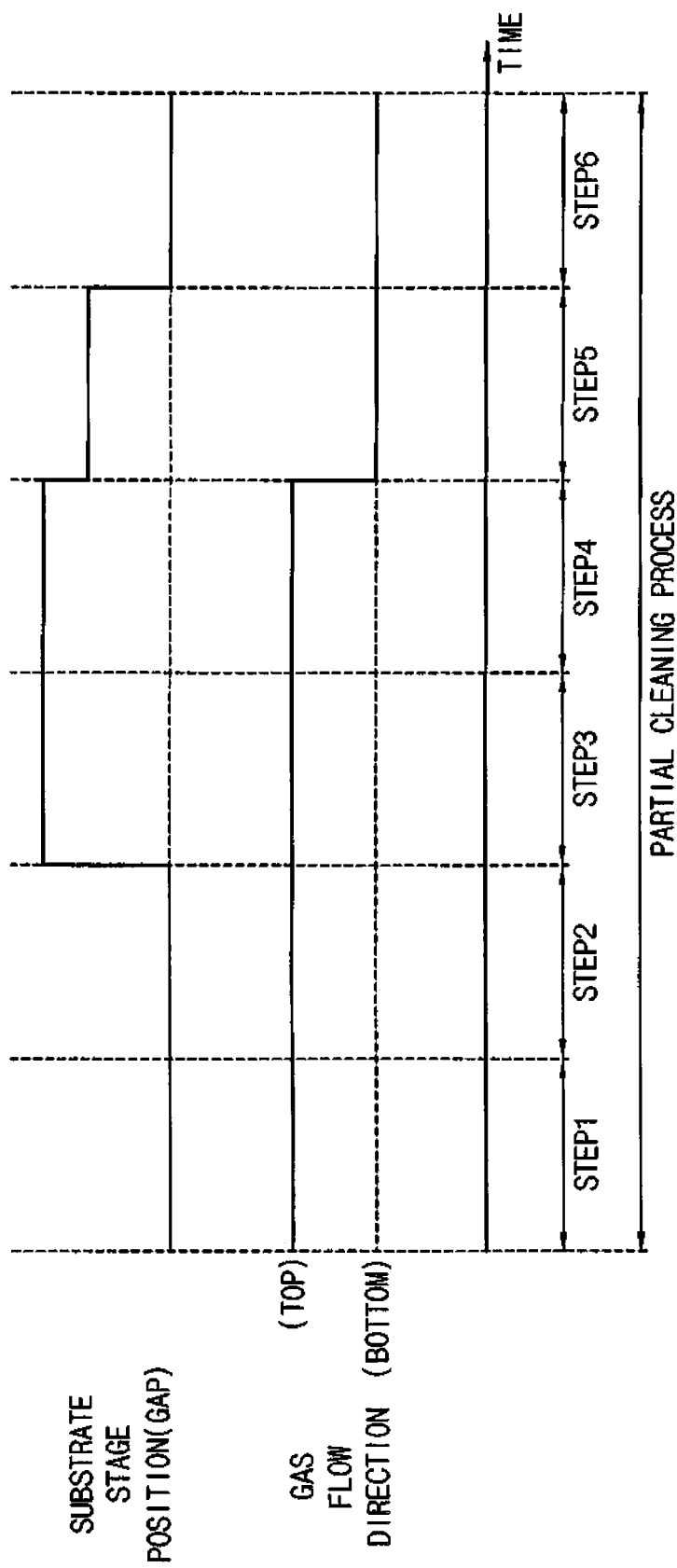

FIG. 3 is a flow chart illustrating a substrate processing method in accordance with example embodiments. FIG. 4 is a timing diagram illustrating the substrate processing method in FIG. 3. FIG. 5 is a timing diagram illustrating a partial cleaning process performed in-situ with a deposition process in the substrate processing method in FIG. 3. FIGS. 6A to 6E are cross-sectional views illustrating a cumulative layer deposited within a chamber where the substrate process method in FIG. 3 is performed. The substrate processing method may be applied for forming a layer on wafers in a chemical vapor deposition chamber and cleaning an inside of the chamber, however, it may not be limited thereto.

Referring to FIGS. 1 to 6E, first, deposition processes P1 for depositing a layer on a substrate W may be performed repeatedly within a chamber 110 (S100).

In example embodiments, the chamber 110 may be a chamber for a CVD process. For example, the substrate W may be manufactured from a semiconductor wafer such as silicon wafer or germanium wafer. The substrate W may include various structures (not illustrated) thereon.

The deposition process may be performed to form a metal layer on the substrate W. For example, the metal layer may include a metal having low resistance such as titanium, tungsten, tantalum, platinum, etc or a metal nitride such as titanium nitride, tantalum nitride, etc.

In example embodiments, a source gas and a reaction gas as a thin-film source gas may be supplied on the substrate W on a substrate stage 120 within the chamber 110 through the shower head 140. In the deposition process, the chamber 110 may be maintained at temperature of about 550° C.

In particular, the source gas from a gas supply source 150 may be introduced to the shower head 140 through a first gas supply line 152a and a first gas passage 113a. The reaction gas from a reaction gas supply source may be introduced to the shower head 140 through a second gas supply line 152b and a second gas passage 113b. The source gas may include a titanium chloride ($TiCl_4$) gas. The reaction gas may include an ammonia ($NH_3$) gas, a hydrogen ($H_2$) gas, etc. Thus, a titanium nitride (TiN) layer may be formed on the substrate W.

For example, the deposition processes P1 may be performed repeatedly on 200 to 2000 substrates W. In here, reaction products such as the titanium nitride (TiN) layer may be deposited on inner components within the chamber 110 such as a chamber sidewall, a substrate stage, a shower head, etc.

Figure 6A:
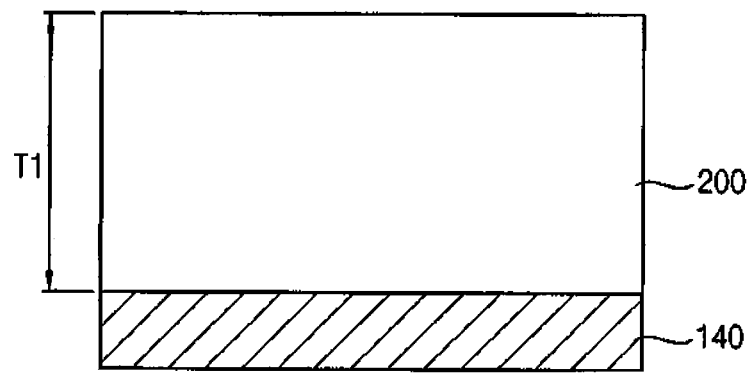
FIGS. 6A to 6E are cross-sectional views illustrating a cumulative layer deposited within a chamber where the substrate process method in FIG. 3 is performed.

As illustrated in FIG. 6A, a cumulative layer 200 deposited on a surface of the shower head 140 within the chamber 110 by the deposition processes P1 may have a first thickness T1. The first thickness T1 may be a thickness of the cumulative layer that is deposited within the chamber 110 when 1500 deposition processes P1 have been performed. For example, the first thickness T1 may be about 1200 μm.

Then, after the deposition processes P1 are completed, a partial cleaning process P2 may be performed on the cumulative layer 200 within the chamber 110 (S110).

In example embodiments, a first cleaning gas may be supplied from above the substrate stage 120 into the chamber 110 through the shower head 140. A second cleaning gas may be supplied from below the substrate stage 120 into the chamber 110 through a lower gas injection nozzle 144. In the partial cleaning process, the chamber 110 may be maintained at a temperature the same as the temperature in the deposition process, for example, about 550° C.

In particular, the first cleaning gas from a cleaning gas supply source may be introduced to the shower head 140 through the first gas supply line 152a and the first gas passage 113a. The first cleaning gas from the cleaning gas supply source may be introduced to the shower head 140 through the second gas supply line 152a and the second gas passage 113b. The second cleaning gas from the cleaning gas supply source may be introduced to the lower gas injection nozzle 144 through a third gas supply line 154. The first and second cleaning gases may include a chlorine fluoride ($ClF_3$) gas. A flow rate of the first cleaning gas may be the same as or different from a flow rate of the second cleaning gas. For example, the flow rate of the second cleaning gas may be greater than the flow rate of the first cleaning gas. Thus, a portion of the cumulative layer deposited within the chamber 110 may be removed.

Figure 6B:
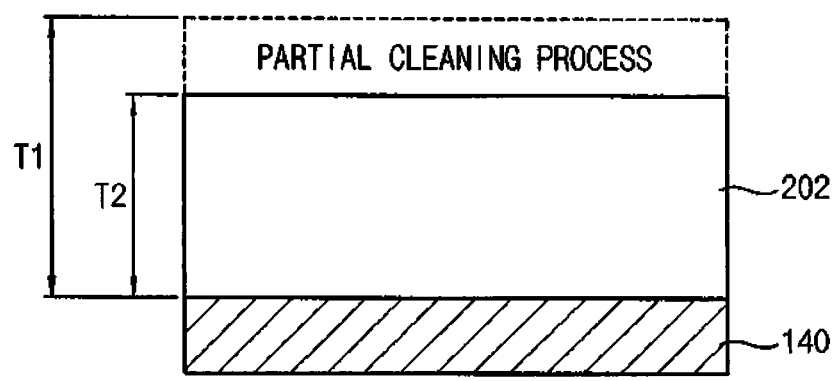

As illustrated in FIG. 6B, a remaining cumulative layer 202 after the partial cleaning process P2 is performed may have a second thickness T2. The second thickness may be a thickness of the cumulative layer 202 that remains within the chamber 110 after the partial clean processes P2 has been performed. For example, the thickness of the cumulative layer 200 removed by the partial cleaning process P2 may be a thickness of the cumulative layer that is deposited within the chamber 110 when 200 deposition processes P1 have been performed. For example, the second thickness T2 may be about 1.6 μm.

Figure 6C:
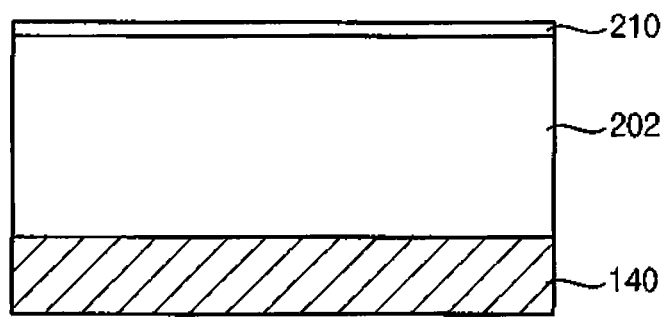

In example embodiments, as illustrated in FIG. 6C, after the partial cleaning process P2 is performed, a pre-coating process may be performed on a surface of the remaining cumulative layer 202 to form a buffer layer 210. The pre-coating process may be performed similarly to the deposition process.

In the pre-coating process, the chamber 110 may be maintained at a temperature of about 550° C. The source gas from the source gas supply source may be introduced to the shower head 140 through the first gas supply line 152a and the first gas passage 113a, and the shower head 140 may inject the source gas into the chamber 110. Then, the reaction gas from the reaction gas supply source may be introduced to the shower head 140 through the second gas supply line 152b and the second gas passage 113b, and the shower head 140 may inject the reaction gas on the wafer W on the substrate stage 120. Thus, the buffer layer 210 may be formed on the remaining cumulative layer 202 on the shower head 140. The buffer layer 210 may include titanium nitride (TiN).

Then, deposition processes P3 may be performed repeatedly on a plurality of substrates W (S120).

For example, the deposition processes P3 may be performed repeatedly on 200 substrates W. In here, reaction products such as the titanium nitride (TiN) layer may be deposited on the inner components within the chamber 110 such as the chamber sidewall, the substrate stage, the shower head, etc.

Figure 6D:
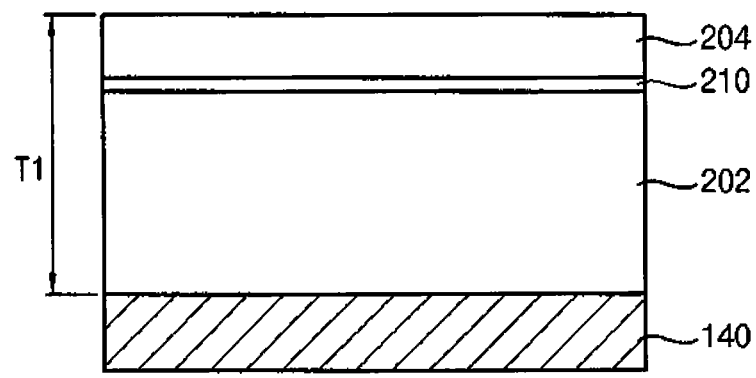

As illustrated in FIG. 6D, a cumulative layer 202, 210, 204 deposited on the surface of the shower head 140 within the chamber 110 by the deposition processes P3 may have a first thickness T1. For example, the first thickness T1 may be about 1200 μm.

Then, a partial cleaning process P2 and deposition processes P3 may be performed alternately and repeatedly (S130).

Figure 6E:
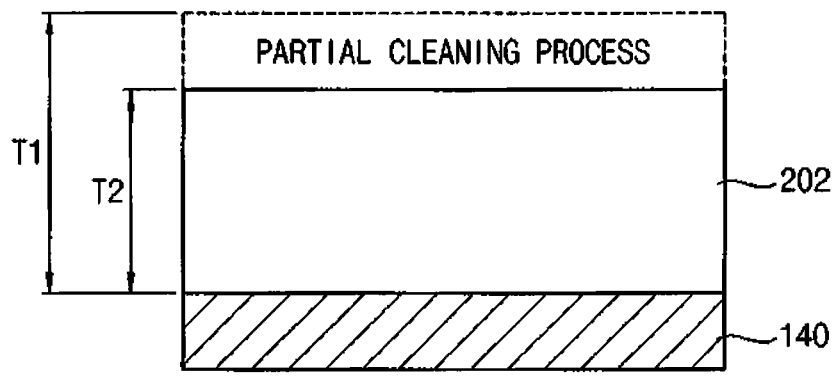

As illustrated in FIG. 6E, a remaining cumulative layer 202 after the partial cleaning process P2 is performed may have a second thickness T2. The second thickness T2 may be a thickness of the cumulative layer 202 that remains within the chamber 110 after the partial clean processes P2 has been performed. For example, the thickness of the cumulative layer removed by the partial cleaning process P2 may be a thickness of the cumulative layer that is deposited within the chamber 11Q when 200 deposition processes P1 have been performed. For example, the second thickness T2 may be about 1.6 μm.

Then, a full cleaning process may be performed to completely remove the cumulative layer within the chamber 110 (S140).

As illustrated in FIG. 5, the partial cleaning process P2 may include multi-steps. For example, in example embodiments, the partial cleaning process P2 may include total six steps.

For example, in step 1, a distance between the substrate stage 120 and the shower head 140 may be maintained at a first gap G1, and the first cleaning gas may be injected from above the substrate stage 120 into the chamber 110. The first cleaning gas from the cleaning gas supply source may be introduced to the shower head 140 through the first gas supply line 152a and the first gas passage 113a, and the shower head 140 may inject the first cleaning gas from above the substrate stage 120 into the chamber 110.

In step 2, the distance between the substrate stage 120 and the shower head 140 may be maintained at the first gap G1, and the first cleaning gas from the cleaning gas supply source may be introduced to the shower head 140 through the second gas supply line 152b and the second gas passage 113b, and the shower head 140 may inject the first cleaning gas from above the substrate stage 120 into the chamber 110.

As illustrated in FIG. 5, in step 3, the distance between the substrate stage 120 and the shower head 140 may be maintained at a second gap G2 greater than the first gap G1, and the first cleaning gas from the cleaning gas supply source may be introduced to the shower head 140 through the first gas supply line 152a and the first gas passage 113a, and the shower head 140 may inject the first cleaning gas from above the substrate stage 120 into the chamber 110.

In step 4, the distance between the substrate stage 120 and the shower head 140 may be maintained at the second gap G2 greater than the first gap G1, and the first cleaning gas from the cleaning gas supply source may be introduced to the shower head 140 through the second gas supply line 152b and the second gas passage 113b, and the shower head 140 may inject the first cleaning gas from above the substrate stage 120 into the chamber 110.

In step 5, the distance between the substrate stage 120 and the shower head 140 may be maintained at a third gap G3, and the second cleaning gas from the cleaning gas supply source may be introduced to the lower gas injection nozzle 144 through the third gas supply line 154, and the lower gas injection nozzle 144 may inject the second cleaning gas from below the substrate stage 120 into the chamber 110.

In step 6, the distance between the substrate stage 120 and the shower head 140 may be maintained at a fourth gap G4 greater than the third gap G3, and the second cleaning gas from the cleaning gas supply source may be introduced to the lower gas injection nozzle 144 through the third gas supply line 154, and the lower gas injection nozzle 144 may inject the second cleaning gas from below the substrate stage 120 into the chamber 110.

As mentioned above, in the substrate process method, the partial cleaning process for removing the portion of the cumulative layer deposited within the chamber 110 by the deposition processes may be performed in-site with the deposition process at the same temperature as in the deposition process. When the partial cleaning process is performed, a flow direction of the cleaning gas and the distance between the substrate stage and the shower head may be adjusted. After performing the partial cleaning process, the buffer layer may be formed on the cumulative layer within the chamber.

Accordingly, the partial cleaning process may be performed in-situ with the deposition process at the same temperature as in the deposition process, to thereby improve process productivity. Additionally, the flow direction of the cleaning gas supplied into the chamber may be adjusted to have uniform concentration distribution and the distance between the substrate stage and the shower head may be adjusted to provide uniform temperature distribution within the chamber, such that the cumulative layer remaining within the chamber is maintained to have a uniform thickness. Thus, maintenance time of the deposition equipment may be shortened and thickness distribution between layers deposited on the wafers may be improved and damage to inner components within the chamber by the cleaning process may be prevented.

Further, the buffer layer may alleviate the surface of the cumulative layer partially removed by the partial cleaning process, such that the cumulative layer has uniform emissivity. Accordingly, a deposition process to be performed after the partial cleaning process may have a process condition the same as that of the deposition process prior to the partial cleaning process.

Hereinafter, a method of manufacturing a semiconductor device using the substrate processing method will be explained.

FIGS. 7 to 11 are cross-sectional views illustrating a method of manufacturing a semiconductor device in accordance with example embodiments. For example, FIGS. 7 to 11 may illustrate a method of manufacturing a non-volatile semiconductor device having a 3-dimensional structure or a vertical type memory device including a vertical channel.

In FIGS. 7 to 11, a direction vertically extending from an upper surface of a substrate may be defined as a first direction. Furthermore, two directions that are parallel with the upper surface of the substrate and cross each other may be defined as a second direction and a third direction, respectively. For example, the second direction and third direction may cross each other perpendicularly.

Figure 7:
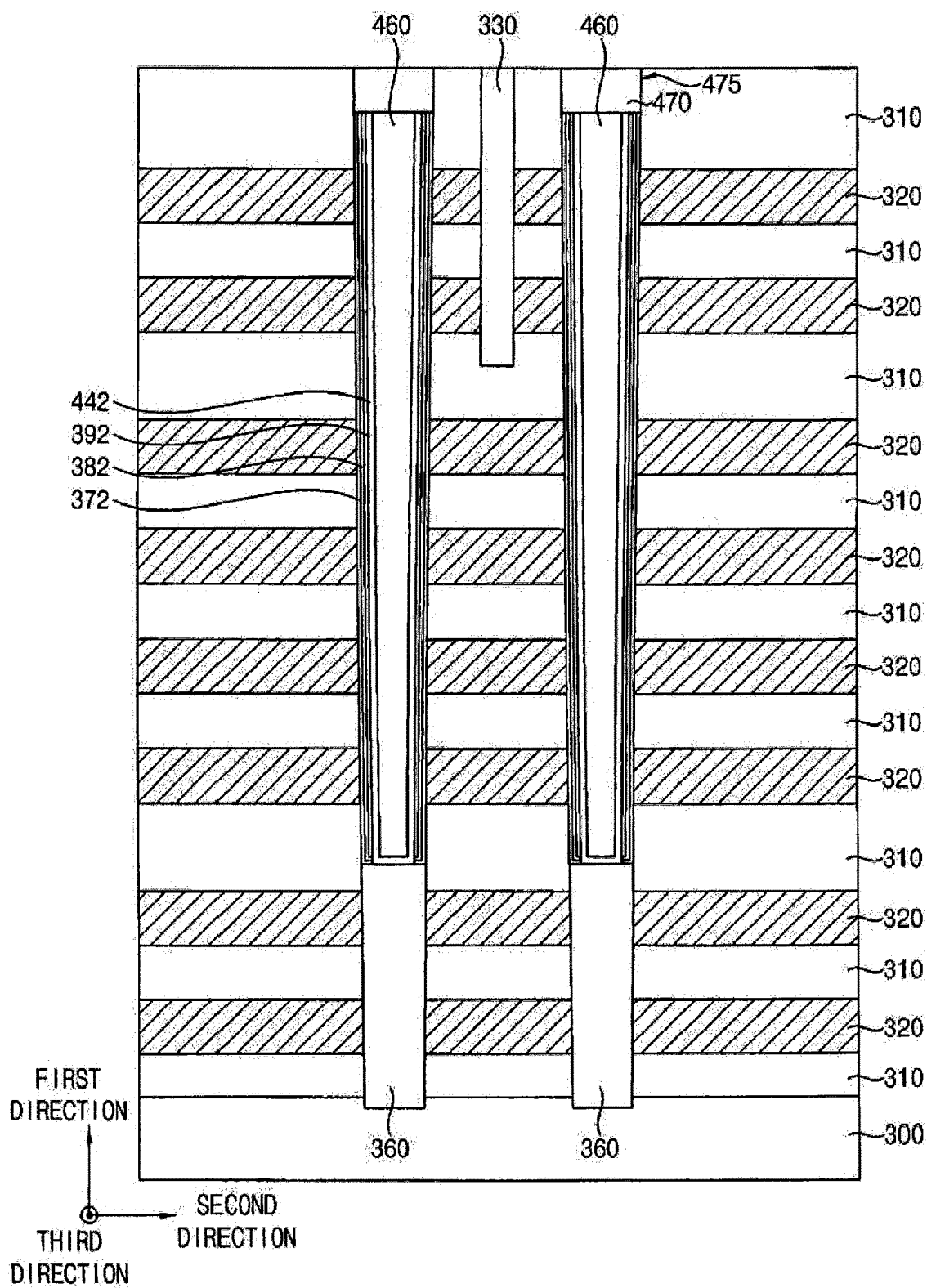

Referring to FIG. 7, vertical channel structures may be formed in channel holes formed in a mold structure including first insulation layers 310 and sacrificial layers 320 stacked alternately and repeatedly on a substrate 300.

In example embodiments, the first insulation layers 310 may include silicon oxide. The sacrificial layers 320 may include a material that may have an etching selectivity with respect to the first insulation layer 310, for example, silicon nitride.

The channel holes may penetrate through the first insulation layers 310 and the sacrificial layers 320 to expose a top surface of the wafer substrate 300. The vertical channel structure may include a first blocking layer pattern 372, a charge trap layer pattern 382, a tunnel insulation layer pattern 392, a channel 442 and a second insulation layer pattern 460 sequentially formed in the channel hole.

Figure 8:
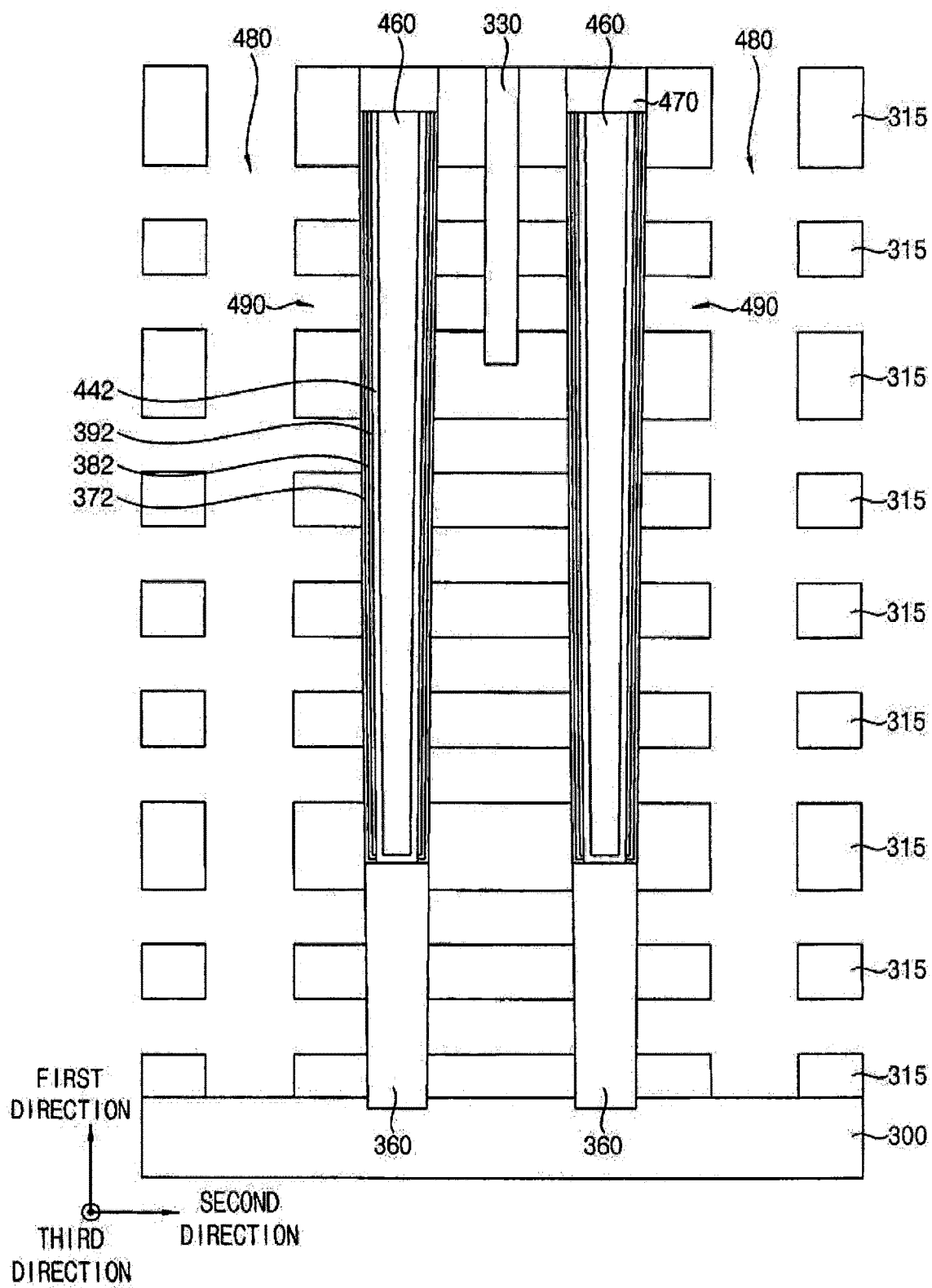

Referring to FIG. 8, a first opening 480 may be formed through the first insulation layers 310 and the sacrificial layers 320 to expose the top surface of the wafer substrate 300, and then, a gap 490 may be formed between first insulation layer patterns 315 to expose an outer sidewall of the first blocking layer pattern 372.

Figure 9:
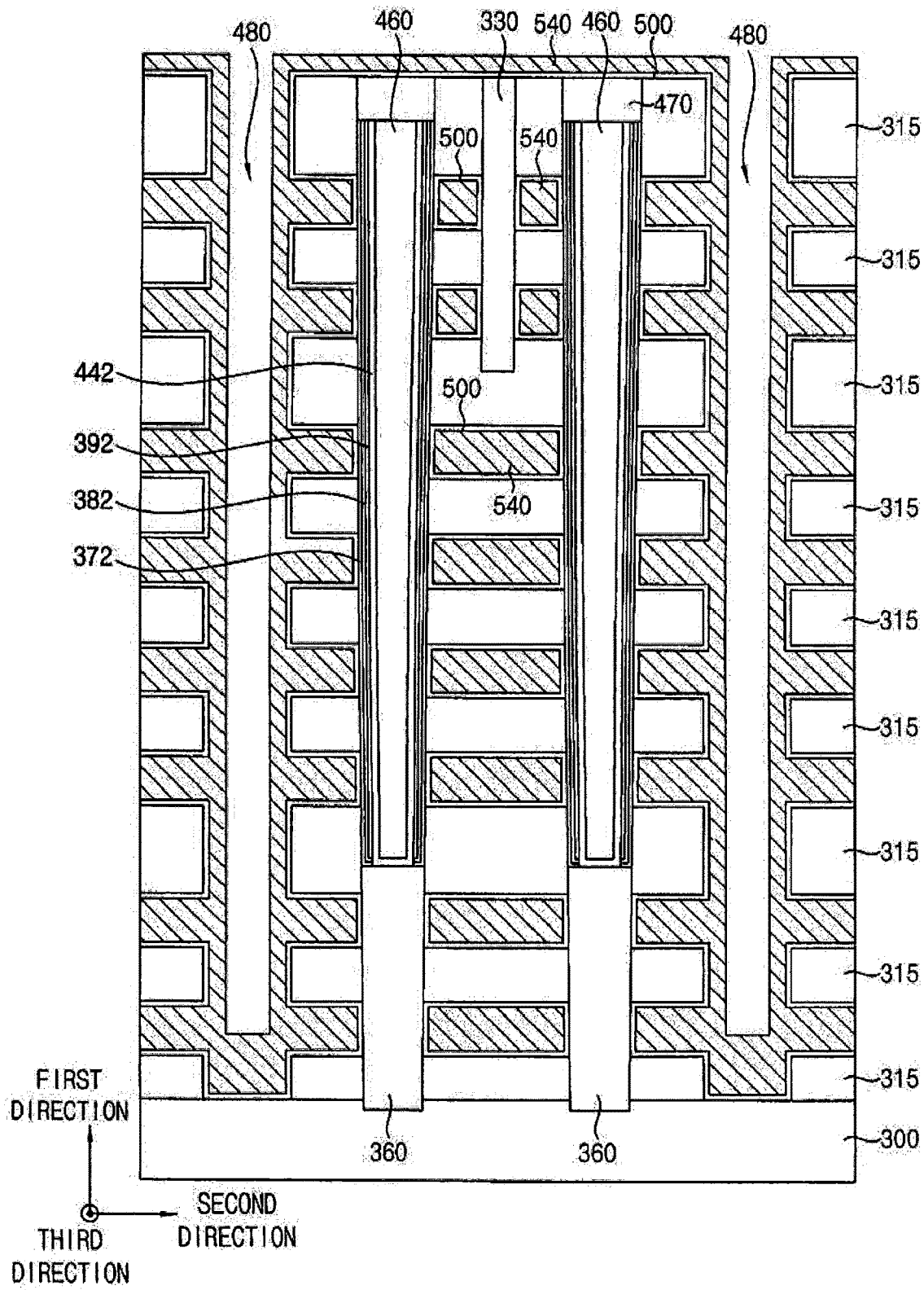

Referring to FIG. 9, a second blocking layer 500 may be formed on the exposed portion of the outer sidewall of the first blocking layer pattern 372, the exposed portion of the sidewall of the semiconductor pattern 360, an inner wall of the gap 490, a surface of the first insulation layer pattern 315, the exposed top surface of the substrate 300, a top surface of a pad 470, and a top surface of a division layer pattern 330, and then, a gate electrode layer 540 may be formed on the second blocking layer 500 to sufficiently fill remaining portions of the gap 490.

In example embodiments, the second blocking layer 500 may be formed to include, for example, a metal oxide. For example, the metal oxide may include aluminum oxide, hafnium oxide, lanthanum oxide, lanthanum aluminum oxide, lanthanum hafnium oxide, hafnium aluminum oxide, titanium oxide, tantalum oxide and/or zirconium oxide.

In example embodiments, the gate electrode layer 540 may be formed using the substrate processing apparatus and the substrate processing method as described with reference to FIGS. 1 to 11. The gate electrode layer 540 may be formed by the deposition process of the substrate processing method.

As illustrated in FIG. 1, after the wafer substrate 300 is loaded onto a substrate stage 120 of the substrate processing apparatus 100, a source gas and a reaction gas may be supplied to the wafer substrate 300 through a shower head 140 to form the gate electrode layer 540. The source gas may include a titanium chloride (TiCl$_4$) gas. The reaction gas may include an ammonia (NH$_3$) gas, a hydrogen (H$_2$) gas, etc. The gate electrode layer 540 may include a metal such as titanium or a metal nitride such as titanium nitride.

Figure 10:
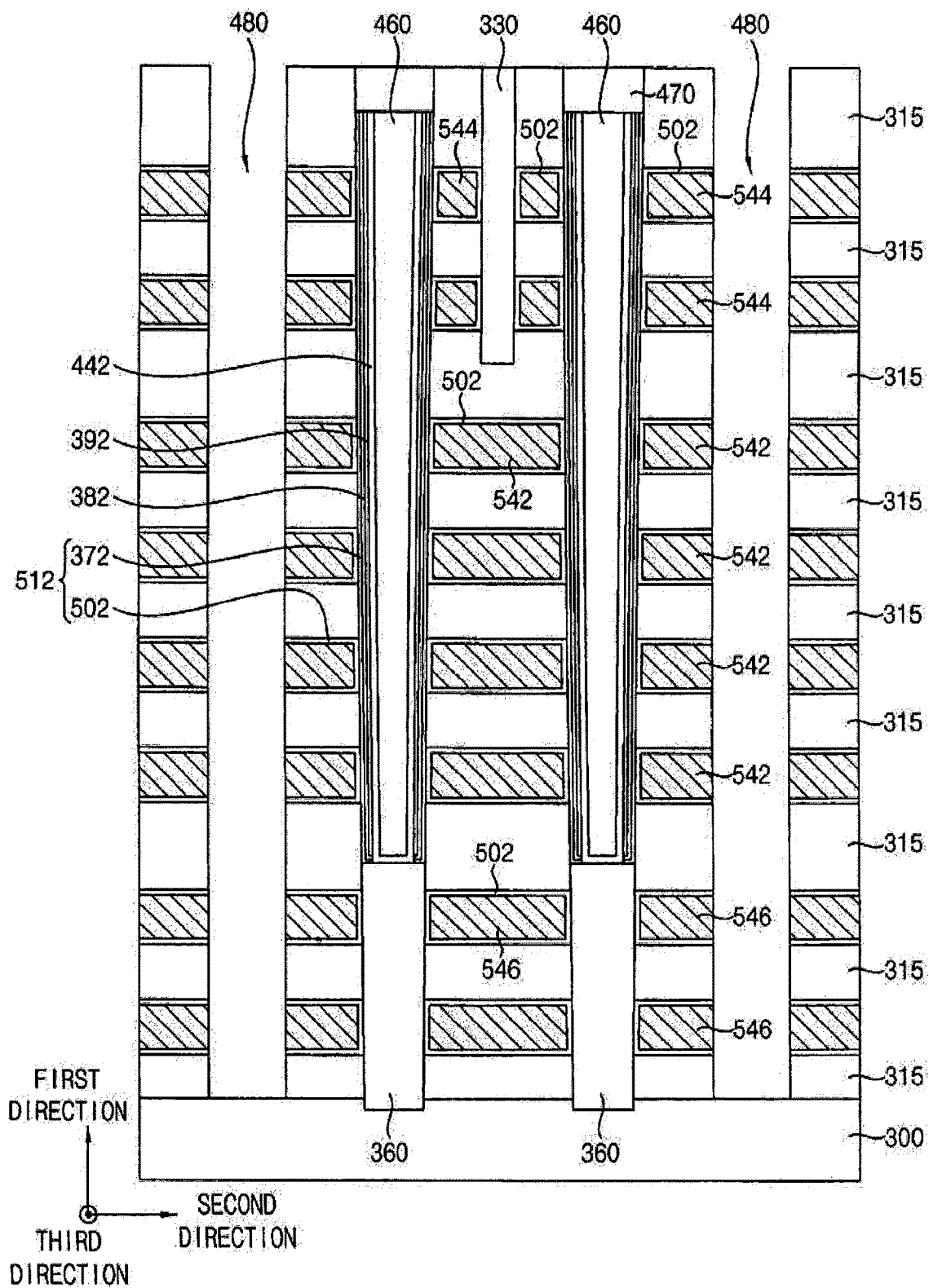

Referring to FIG. 10, the gate electrode layer 540 may be partially removed to form gate electrodes 542, 544, and 546 in the gap 490. In example embodiments, the gate electrode layer 540 may be partially removed through a wet etch process.

Figure 11:
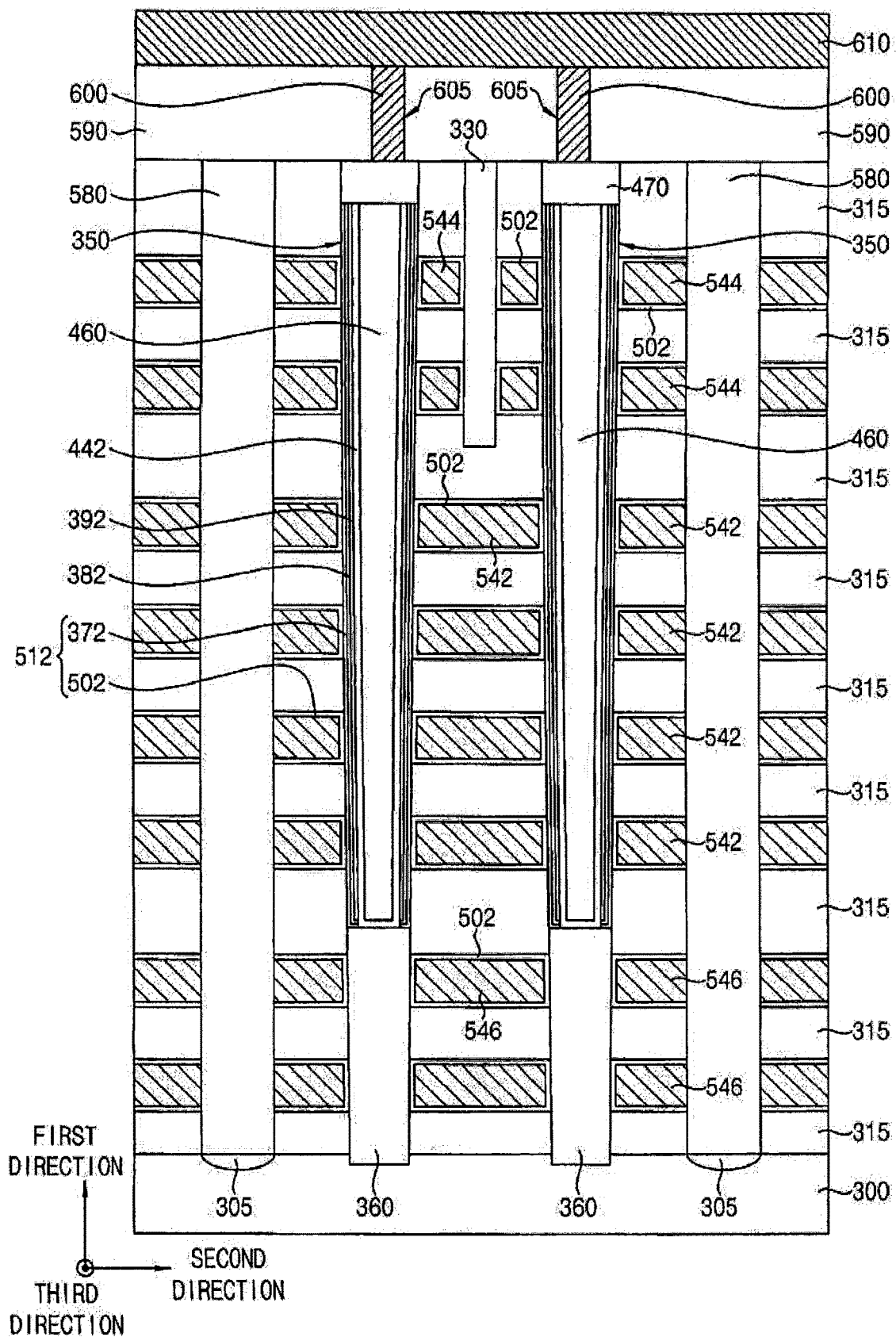

Referring to FIG. 11, a third insulation layer pattern 580 filling the first opening 480 may be formed. In example embodiments, after the third insulation layer pattern 580 filling the first opening 480 is formed on the substrate 300 and the uppermost first insulation layer pattern 315, the third insulation layer may be planarized until a top surface of the uppermost first insulation layer pattern 315 may be exposed to form a third insulation layer pattern 580.

Then, a fifth insulation layer 590 may be formed on the first and third insulation layer patterns 315 and 380, the pad 470, and the division layer pattern 330, and a second opening 605 may be formed to expose a top surface of the pad 470. In example embodiments, a plurality of second openings 605 corresponding to the pads 470 may be formed to define a second opening array.

Then, a bit line contact 600 may be formed on the pad 470 to fill the second opening 605, and a bit line 610 electrically connected to the bit line contact 600 may be formed to complete the vertical memory device. The bit line 610 and the bit line contact 600 may be formed to include, for example, a metal, a metal nitride, and/or doped polysilicon.

In example embodiments, a plurality of bit line contacts 600 corresponding to the pads 470 may be formed to define a bit line contact array, a plurality of bit lines 610 may be formed in the third direction, and each bit line 610 may be formed to extend in the second direction.

The above substrate processing apparatus and substrate processing method may be used to manufacture semiconductor devices including logic devices and memory devices. For example, the semiconductor device may be applied to various systems such as a computing system. The semiconductor device may include finFET, DRAM, VNAND, etc. The system may be applied to a computer, a portable computer, a laptop computer, a personal portable terminal, a tablet, a cell phone, a digital music player, etc.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A substrate processing method, comprising:
   i) performing deposition processes at a first temperature on a plurality of substrates within a chamber respectively, wherein a cumulative layer that is deposited within the chamber after the step i) is performed has a first thickness;
   ii) performing a partial cleaning process at the first temperature to remove a portion of the cumulative layer, wherein the cumulative layer remaining within the chamber after the step ii) is performed has a second thickness less than the first thickness, wherein performing the cleaning process comprises:
   supplying a first cleaning gas from above a substrate stage within the chamber via at least one gas injection nozzle positioned over and facing the substrate stage; and
   supplying a second cleaning gas from below the substrate stage within the chamber via at least one gas injection nozzle positioned below and facing the substrate stage;
   wherein a distance between the substrate stage and the at least one gas injection nozzle is adjusted to provide a uniform temperature distribution within the chamber during the partial cleaning process;
   iii) performing the deposition processes at the first temperature on a plurality of substrates within the chamber respectively, wherein the cumulative layer remaining within the chamber after the step iii) is performed has the first thickness; and
   iv) performing the step ii) and the step iii) alternately and repeatedly; and
   v) after the step iv), performing a full cleaning process to completely remove the cumulative layer within the chamber.

2. The substrate processing method of claim 1, further comprising:
   in the step ii), after performing the cleaning process, forming a buffer layer on the cumulative layer within the chamber, wherein forming the buffer layer is performed at the first temperature.

3. The substrate processing method of claim 1, wherein a flow rate of the second cleaning gas is different from a flow rate of the first cleaning gas.

4. The substrate processing method of claim 1,
   wherein supplying the first cleaning gas comprises:
      maintaining the substrate stage at a first height for a first period of time; and then
      maintaining the substrate stage at a second height different from the first height for a second period of time; and
   wherein supplying the second cleaning gas comprises:
      maintaining the substrate stage at a third height for a third period of time; and then
      maintaining the substrate stage at a fourth height different from the third height for a fourth period of time.

5. A substrate processing method, comprising:
   i) performing deposition processes at a first temperature on a plurality of substrates within a chamber respectively to deposit a cumulative layer having a first thickness within the chamber;
   ii) performing a partial cleaning process on the cumulative layer such that the cumulative layer has a second thickness less than the first thickness, wherein performing the partial cleaning process comprises:
   supplying a first cleaning gas from above a substrate stage within the chamber via at least one gas injection nozzle positioned over and facing the substrate stage; and
   supplying a second cleaning gas from below the substrate stage within the chamber via at least one gas injection nozzle positioned below and facing the substrate stage;
   wherein a distance between the substrate stage and the at least one gas injection nozzle is adjusted to provide a uniform temperature distribution within the chamber during the partial cleaning process;

iii) after performing the partial cleaning process, performing the deposition processes at the first temperature to form a buffer layer on the cumulative layer;

iv) performing the deposition processes at the first temperature on a plurality of substrates within the chamber respectively to deposit the cumulative layer having the first thickness within the chamber;

v) performing the step ii), the step iii) and the step iv) alternately and repeatedly; and vi) after the step v), performing a full cleaning process to completely remove the cumulative layer within the chamber.

6. The substrate processing method of claim 5, wherein the buffer layer comprises a material the same as the cumulative layer.

7. The substrate processing method of claim 5, wherein a flow rate of the second cleaning gas is different from a flow rate of the first cleaning gas.

8. The substrate processing method of claim 5,
wherein supplying the first cleaning gas comprises:
maintaining the substrate stage at a first height for a first period of time; and then
maintaining the substrate stage at a second height different from the first height for a second period of time; and
wherein supplying the second cleaning gas comprises:
maintaining the substrate stage at a third height for a third period of time; and then
maintaining the substrate stage at a fourth height different from the third height for a fourth period of time.

9. The substrate processing method of claim 5, wherein the first and second cleaning gases comprises a same gas.

10. The substrate processing method of claim 5, wherein the cumulative layer within the chamber comprises titanium.

11. A substrate processing method, comprising:
i) performing deposition processes on a plurality of substrates within a chamber respectively;

ii) performing a partial cleaning process to remove a portion of a cumulative layer that is deposited within the chamber by the deposition processes, wherein performing the cleaning process comprises:
supplying a first cleaning gas from above a substrate stage within the chamber via at least one gas injection nozzle positioned over and facing the substrate stage; and
supplying a second cleaning gas from below the substrate stage within the chamber via at least one gas injection nozzle positioned below and facing the substrate stage;
wherein a distance between the substrate stage and the at least one gas injection nozzle is adjusted to provide a uniform temperature distribution within the chamber during the partial cleaning process;

iii) performing the deposition processes repeatedly within the chamber;

iv) performing the step ii) and the step iii) alternately and repeatedly; and v) after the step iv), performing a full cleaning process to completely remove the cumulative layer within the chamber, wherein the cumulative layer remaining within the chamber after the deposition processes are performed has a first thickness, and the cumulative layer remaining within the chamber after the partial cleaning process is performed has a second thickness less than the first thickness.

12. The substrate processing method of claim 11, wherein the deposition processes and the cleaning process are performed at a same temperature.

13. The substrate processing method of claim 11, further comprising:
after performing the partial cleaning process, forming a buffer layer on the cumulative layer within the chamber.

* * * * *